(12) United States Patent
Zong et al.

(10) Patent No.: US 12,091,574 B2
(45) Date of Patent: Sep. 17, 2024

(54) HYDROPHOBIC SURFACE COATING AND PREPARATION METHOD THEREFOR

(71) Applicant: JIANGSU FAVORED NANOTECHNOLOGY CO., LTD., Wuxi (CN)

(72) Inventors: Jian Zong, Wuxi (CN); Bixian Kang, Wuxi (CN); Yingjing Dai, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 305 days.

(21) Appl. No.: 17/628,922

(22) PCT Filed: Jun. 18, 2020

(86) PCT No.: PCT/CN2020/096722
§ 371 (c)(1),
(2) Date: Jan. 21, 2022

(87) PCT Pub. No.: WO2021/017674
PCT Pub. Date: Feb. 4, 2021

(65) Prior Publication Data
US 2022/0251394 A1   Aug. 11, 2022

(30) Foreign Application Priority Data

Jul. 26, 2019 (CN) .......................... 201910680686.6
Aug. 2, 2019 (CN) .......................... 201910712672.8
Feb. 24, 2020 (CN) .......................... 202010112881.1
Feb. 24, 2020 (CN) .......................... 202010112882.6

(51) Int. Cl.
*C09D 5/00*   (2006.01)
*C03C 17/32*   (2006.01)
*C09D 133/16*   (2006.01)

(52) U.S. Cl.
CPC ................ *C09D 5/00* (2013.01); *C03C 17/32* (2013.01); *C09D 133/16* (2013.01); *C03C 2217/76* (2013.01); *C03C 2218/153* (2013.01)

(58) Field of Classification Search
None
See application file for complete search history.

(56) References Cited

U.S. PATENT DOCUMENTS

| 2005/0089803 | A1 | 4/2005 | Bouaidat et al. |
| 2005/0133059 | A1 | 6/2005 | Chen et al. |
| 2006/0240648 | A1* | 10/2006 | Mikhael ............ H01J 37/32009 257/E21.259 |
| 2008/0241523 | A1 | 10/2008 | Huignard et al. |
| 2008/0254212 | A1 | 10/2008 | Elizalde et al. |
| 2009/0286133 | A1 | 11/2009 | Trabold et al. |
| 2010/0040790 | A1 | 2/2010 | Elizalde et al. |
| 2011/0319546 | A1 | 12/2011 | Iyer et al. |
| 2013/0089807 | A1 | 4/2013 | Hong et al. |
| 2014/0178641 | A1 | 6/2014 | Leblanc et al. |
| 2014/0370300 | A1 | 12/2014 | Smith |
| 2015/0240354 | A1 | 8/2015 | Han et al. |
| 2016/0376025 | A1 | 12/2016 | Bimanand et al. |
| 2022/0235240 | A1 | 7/2022 | Zong |

FOREIGN PATENT DOCUMENTS

| CN | 1145941 | 3/1997 |
| CN | 1990899 | 7/2007 |
| CN | 101263259 | 9/2008 |
| CN | 101487904 | 7/2009 |
| CN | 101535560 | 9/2009 |
| CN | 101582516 | 11/2009 |
| CN | 102797166 | 11/2012 |
| CN | 102963863 | 3/2013 |
| CN | 103097474 | 5/2013 |
| CN | 106835043 | 6/2017 |
| CN | 107058979 | 8/2017 |
| CN | 107428972 | 12/2017 |
| CN | 109181481 | 1/2019 |
| CN | 110129769 | 8/2019 |
| CN | 110665768 | 1/2020 |
| EP | 0745568 | 12/1996 |
| EP | 3569733 | 11/2019 |
| JP | 200316063 A | 6/2003 |
| JP | 2004035941 A * | 2/2004 |
| JP | 2005/015851 | 1/2005 |
| JP | 2015/519219 | 7/2015 |
| KR | 20150118927 | 10/2015 |
| WO | WO 2018/133237 A1 | 7/2018 |
| WO | WO 2021/017663 A1 | 2/2021 |

OTHER PUBLICATIONS

Machine translation of JP 2004/035941 A (Year: 2004).*
Extended European Search Report issued in European Patent Application No. EP20848496.4, dated Sep. 7, 2023.
Office Communication issued in correspondence Japanese Application No. 2022-501166 dated Dec. 21, 2022 { Original and English translation }.
English translation of International Search Report issued in International Patent Application No. PCT/CN2020/096722, dated Sep. 16, 2020.

* cited by examiner

Primary Examiner — Ramsey Zacharia
(74) Attorney, Agent, or Firm — Parker Highlander PLLC

(57) ABSTRACT

The present invention provides a hydrophobic surface coating and a preparation method therefor. The hydrophobic surface coating uses one or more fluorinated alcohol compounds as a reaction gas material, and is formed on a surface of a base body by a plasma-enhanced chemical vapor deposition method, to improve the hydrophobicity, the chemical resistance, and the weatherability of the surface of the base body.

19 Claims, No Drawings

HYDROPHOBIC SURFACE COATING AND PREPARATION METHOD THEREFOR

This application is a national phase application under 35 U.S.C. § 371 of International Application No. PCT/CN2020/096722, filed Jun. 18, 2020, which claims the benefit of priority to Chinese Patent Application No. 201910680686.6, filed Jul. 26, 2019, Chinese Patent Application No. 201910712672.8, filed Aug. 2, 2019, Chinese Patent Application No. 202010112881.1, filed Feb. 24, 2020, and Chinese Patent Application No. 202010112882.6, filed Feb. 24, 2020.

TECHNICAL FIELD

The present disclosure relates to the field of surface coating, and further, to forming a hydrophobic surface coating by a plasma-enhanced chemical vapor deposition method.

BACKGROUND

With the improvement of technology level and the expansion of market scale, waterproof processing may be applied to different surfaces, such as metals, printed circuit board (PCB), fabrics, electronic devices, etc., to give them performance to prevent surface from being damaged by water, liquid, rain, etc., prolong the service life and reduce additional costs.

The monomer materials most used to achieve this kind of waterproof effect are fluorocarbon materials. Fluorocarbon materials may form a negative charge protection at an interface due to low surface energy, strong covalent bonds, zigzag carbon chain structure and spiral conformation, and are often used in textile, military, electronics and other fields. Currently, the most used fluorocarbon materials are perfluoroacrylates with long Rf (fluorocarbon chain length≥8). CN101370975A discloses a new type of product in which perfluoroacrylate monomers, preferably 1H,1H,2H,2H-heptadecafluorodecyl acrylate, are selected to form a polymer coating on the surface of fabrics such as clothes.

Although perfluoroacrylate materials with long Rf may impart excellent properties to different surfaces, fluorocarbon materials of perfluoroacrylates are mainly concentrated in a few areas due to the limitation of raw materials, and at the same time, they are mainly synthesized from fluorinated alcohol and acrylic acid, etc., through a series of processes, with a cumbersome process, which makes the production cost relatively high.

On the other hand, compared with perfluoroacrylate fluorocarbon materials, the reserves of fluorite are relatively abundant. Secondly the development of the refrigerant industry, especially of tetrafluoroethylene and hexafluoropropylene cracking technology and HFC-134a synthesis technology, makes fluorinated alcohol have rapidly reduced raw materials cost and optimized production method, which has strengthened the competitiveness of fluorinated alcohol products in the world market, and has formed a relatively complete fluorinated alcohol industry chain. This will solve certain economic cost issues.

Plasma chemical vapor deposition technology has been widely used to form polymer coatings on different surfaces to protect the surface from damage. This technology uses plasma to activate the reaction gas, this step is performed when a substrate is present, plasma zone compound groups polymerize on or near the surface of the substrate. This technology is considered to be a dry film-forming process relative to the wet chemical method, and has a good adhesion of the deposited thin film to the substrate, an easy coating structure design, a good universality. The property of the formed polymer coating is related to the property of the monomer, the substrate and the coating conditions.

Furthermore, the performance of the surface coating is related not only to the material and formation way of the coating itself, but also to the nature of the substrate itself. The same surface coating attached to different substrates may exhibit different properties, and for the same kind of substrate, there may be a more suitable surface coating.

Glass substrates are currently widely used materials, such as smart phones, tablet computers and other various electronic equipment display screens. In order to improve the performance of the glass itself, it is usually necessary to form a coating on the surface during processing. However, among the current coating materials, most of the coating materials are such materials capable of being applied to a variety of substrates and less specific to special substrates, like the coatings of glass substrates, so that the performance of the coating material itself has certain limitations, and the optimization of the performance of the glass substrate also has limitations.

SUMMARY

An advantage of the present disclosure is to provide a hydrophobic surface coating and a preparation method therefor, wherein perfluoroacrylate fluorocarbon materials are replaced by fluorinated alcohol compounds, thereby reducing economic costs.

Another advantage of the present disclosure is to provide a hydrophobic surface coating and a preparation method therefor, wherein the surface coating is formed from: one or more fluorinated alcohol compounds by a plasma-enhanced chemical vapor deposition method, the manufacturing process being simplified.

Another advantage of the present disclosure is to provide a hydrophobic surface coating and a preparation method therefor, wherein the surface coating formed by the fluorinated alcohol compound(s) on the surface of the substrate has good hydrophobic properties.

Another advantage of the present disclosure is to provide a hydrophobic surface coating and a preparation method therefor, wherein the gaseous raw materials are crosslinked directly during the polymerization deposition process by adding a crosslinking agent, thereby leading to high compactness, relatively good mechanical properties, and savings of the thermal annealing process in the large-scale production process and costs generated thereby.

Another advantage of the present disclosure is to provide a hydrophobic surface coating and a preparation method therefor, wherein the hydrophobic surface coating has high hydrophobicity, resistance to chemical agents, and excellent weatherability.

Another advantage of the present disclosure is to provide a hydrophobic surface coating and a preparation method therefor, wherein a fluorinated alcohol compound and a crosslinking agent are combined and deposit on the surface of the substrate, so that the bonding performance between the hydrophobic surface coating and the substrate is stronger and firmer, and the salt spray corrosion resistance is enhanced.

Another advantage of the present disclosure is to provide a hydrophobic surface coating and a preparation method therefor, wherein the hydrophobic surface coating is more suitable to be deposited on the surface of a glass substrate to improve the surface properties of the glass substrate.

Another advantage of the present disclosure is to provide a hydrophobic surface coating and a preparation method therefor, wherein the material characteristics of the hydrophobic surface coating and the material characteristics of the glass substrate are matched with each other, so that the overall performance is better when the hydrophobic surface coating and the glass substrate are combined.

Another advantage of the present disclosure is to provide a hydrophobic surface coating and a preparation method therefor, wherein the gaseous raw materials are crosslinked directly during the polymerization deposition process by adding a crosslinking agent, leading to high compactness, relatively good mechanical properties, and savings of the thermal annealing process in the large-scale production process and costs generated thereby.

Another advantage of the present disclosure is to provide a hydrophobic surface coating and a preparation method therefor, wherein the hydrophobic surface coating has excellent hydrophobicity, light transmittance and wear resistance.

Another advantage of the present disclosure is to provide a hydrophobic surface coating and a preparation method therefor, wherein a fluorinated alcohol compound and a crosslinking agent are combined and deposit on the surface of the substrate, so that the bonding performance between the hydrophobic surface coating and the substrate is stronger and firmer.

In order to achieve at least one of the above advantages, the present disclosure provides a hydrophobic surface coating, formed on a substrate surface by a plasma-enhanced chemical vapor deposition method with one or more fluorinated alcohol compounds being used as reaction gas raw materials.

According to an embodiment of the present disclosure, the fluorinated alcohol compound has a chemical formula: $C_nF_{2n+1}$—$C_mH_{2m}$—OH, wherein n is an integer from 1 to 12, and m is an integer from 0 to 4.

According to an embodiment of the present disclosure, there are weak sites of methylene in the reaction of the fluorinated alcohol compound.

According to an embodiment of the present disclosure, the fluorinated alcohol compound is a primary alcohol.

According to an embodiment of the present disclosure, the fluorinated alcohol compound is selected from a group consisting of: one or more of perfluorohexyl ethanol and perfluorobutyl ethanol.

According to an embodiment of the present disclosure, the reaction gas raw materials further include a crosslinking agent having a following structural formula:

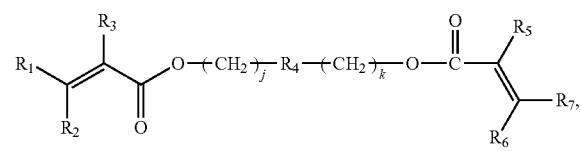

wherein $R_1$, $R_2$, $R_3$, $R_5$, $R_6$ and $R_7$ are selected from hydrogen, alkyl, aryl, halogen, haloalkyl, haloaryl; j and k are integers from 0 to 10 and are not 0 at the same time; and $R_4$ is a bond, —CO—, —COO—, an arylidene, an alicyclic alkylidene, or an aliphatic alkylidene substituted with hydroxy.

According to an embodiment of the present disclosure, the reaction gas raw materials further include a crosslinking agent which is a multifunctional group compound comprising ester groups, ethers, epoxy groups, cyano groups.

According to an embodiment of the present disclosure, the reaction gas raw materials further include a crosslinking agent selected from a group consisting of: one or more of glycidyl methacrylate, allyl glycidyl ether, 1,2-epoxy-4-vinylcyclohexane, 3-(2,3-epoxypropoxy)propylvinyldimethoxysilane, and enbucrilate.

According to an embodiment of the present disclosure, when preparing the hydrophobic surface coating, a plasma source gas is introduced first, so as to activate the chemical deposition reaction of the reaction gas raw materials.

According to an embodiment of the present disclosure, the plasma source gas is selected from: one or more of inert gases.

Another aspect of the present disclosure provides a method for preparing a hydrophobic surface coating, which includes steps of: introducing one or more fluorinated alcohol compound reaction gas raw materials into a reaction chamber of a plasma device, and performing a plasma-enhanced chemical vapor deposition on a surface of a substrate in the plasma device to form the hydrophobic surface coating.

According to an embodiment of the present disclosure, in a method for preparing a hydrophobic surface coating, the fluorinated alcohol compound has a chemical formula: $C_nF_{2n+1}$—$C_mH_{2m}$—OH, wherein n is an integer from 1 to 8, and m is an integer from 2 to 3.

Another aspect of the present disclosure provides a hydrophobic surface coating, with one or more fluorinated alcohol compounds being used as reaction gas raw materials, formed on a surface of a substrate by a plasma-enhanced chemical vapor deposition method, wherein the fluorinated alcohol compound has a structural formula: OH—$C_nH_mF_{2n+1-m}$, wherein n>m+1, and a silanol group is formed on the surface of the substrate under the action of the plasma.

DETAILED DESCRIPTION

The following description is used to disclose the present invention so that those skilled in the art can implement the present invention. The preferred embodiments in the following description are only examples, and those skilled in the art could think of other obvious variations. The basic principles of the present invention defined in the following description may be applied to other embodiments, modifications, improvements, equivalents, and other technical solutions without departing from the spirit and scope of the present invention.

The present disclosure provides a hydrophobic surface coating, formed from: one or more fluorinated alcohols as raw materials. Furthermore, the hydrophobic surface coating is formed on a surface of a substrate by means of plasma-enhanced chemical vapor deposition from: one or more fluorinated alcohols as raw materials.

The hydrophobic surface coating has good hydrophobicity, as well as good chemical corrosion resistance and excellent weatherability.

Further, the hydrophobic surface coating has good hydrophobicity. When water is attached to the waterproof nano-film, it has a static contact angle of greater than 90°. For example, the static contact angle ranges from 90° to 100°, 100° to 110°, 110°~120°, or 120°~130°. The hydrophobic surface coating has good corrosion resistance. For example, when the hydrophobic surface coating deposited on the surface of the substrate undergoes a salt spray test for a relatively long period of time, the surface of the substrate is not corroded or there are only a relatively small number of corrosion points, as shown in the subsequent specific examples.

The hydrophobic surface coating has a relatively small thickness, so that the use of the surface of the substrate will not be affected. The thickness range is exemplified as but not limited to from 10 nm to 1000 nm. For example, the thickness range is selected from: 150 nm to 170 nm, 170 nm to 190 nm, 190 nm to 210 nm, 210 nm to 230 nm, or 230 nm to 250 nm.

According to an embodiment of the present disclosure, the hydrophobic surface coating is formed on the surface of the substrate through a plasma-enhanced chemical vapor deposition (PECVD) process. That is, during the preparation process, the surface of the substrate is exposed in the reaction chamber of the reaction device of a plasma device in which plasma is formed, and the hydrophobic surface coating is formed on the surface of the substrate through the deposition reaction of the reaction raw materials, fluorinated alcohol and/or other reactants.

Compared with other existing deposition processes, the plasma-enhanced chemical vapor deposition (PECVD) process has many advantages: (1) dry film-forming does not need to use an organic solvent; (2) the etching effect of plasma on the substrate surface makes the adhesive property between the deposited thin film and the substrate good; (3) the coating may be uniformly deposited on an irregular substrate surface with an extremely strong vapor permeability; (4) the coating has good designability, the chemical vapor method making it possible to control the coating thickness at the nanometer scale as compared to the liquid phase method with micron level control accuracy; (5) the coating structure is easy to design, the chemical vapor method using plasma to activate, and for a composite coating of different materials, multiple raw materials being possible to be combined together through the control of input energy without designing a specific initiator to initiate; (6) the compactness is good, the chemical vapor deposition method often activating multiple active sites during the plasma initiation process, similar to a solution reaction in which there are multiple functional groups on one molecule, and a crosslinked structure is formed by the multiple functional groups between the molecular chains; and (7) as a technical means for coating processing, its universality is extremely good, and the objects to coat and raw materials used for coating may both be selected from very wide ranges.

The plasma-enhanced chemical vapor deposition (PECVD) process generates plasma through glow discharge, and the discharge method includes radio frequency discharge, microwave discharge, intermediate frequency discharge, electric spark discharge, and the like.

Further, according to an embodiment of the present disclosure, the fluorinated alcohol compound as a reaction raw material has a general structure of $C_nF_{2n+1}$—$C_mH_{2m}$—$OH$, wherein n is an integer from 1 to 12, and m is an integer from 0 to 4. Furthermore, n is an integer from 1 to 8, and m is an integer from 2 to 3.

As an example, the reaction raw material of the fluorinated alcohol compound is selected from: one or more of perfluorobutyl ethanol and perfluorohexyl ethanol.

According to an embodiment of the present disclosure, there are weak sites of methylene in the fluorinated alcohol compound reaction raw materials.

According to an embodiment of the present disclosure, the fluorinated alcohol compound raw material is a primary alcohol.

The fluorinated alcohol compound reaction gas raw material and a crosslinking agent have a vapor deposition reaction to form the hydrophobic surface coating. In other words, the fluorinated alcohol compound and the crosslinking agent are both reaction gas raw materials, and are deposited together on the surface of the substrate to form the hydrophobic surface coating.

The crosslinking agent compound has a structure of the following formula:

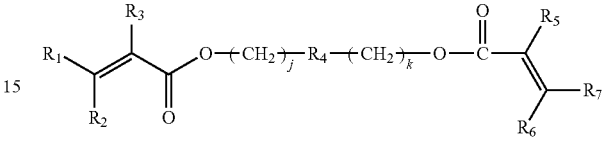

Wherein, $R_1$, $R_2$, $R_3$, $R_5$, $R_6$, and $R_7$ are independently selected from hydrogen, alkyl, aryl, halogen, haloalkyl, and haloaryl; j and k are integers from 0 to 10 and are not 0 at the same time; $R_4$ may be a bond, —CO—, —COO—, an arylidene, an alicyclic alkylidene, or an aliphatic alkylidene substituted with hydroxy. The crosslinking agent may also be a multifunctional group compound comprising ester groups, ethers, epoxy groups, cyano groups.

According to one embodiment, the crosslinking agent of the hydrophobic surface coating is from a group consisting of: glycidyl methacrylate, allyl glycidyl ether, 1,2-epoxy-4-vinylcyclohexane, 3-(2,3-epoxypropoxy)propylvinyldimethoxysilane, and enbucrilate.

Further, according to some embodiments of the present disclosure, when preparing the hydrophobic surface coating, a plasma source gas is introduced into the reaction device, used to activate the chemical deposition reaction of the reaction gas raw materials. The plasma source gas is exemplified as but not limited to an inert gas, wherein the inert gas is exemplified as but not limited to He and Ar. The plasma source gas may be a single gas or a mixture of two or more gases, and may be introduced at the same time as the reaction gas or be introduced sequentially with the reaction gas. Preferably, the plasma source gas is introduced first, and then the reaction gas raw materials are introduced. Of course, in an embodiment of the present disclosure, there may be no plasma source gas, that is, the fluorinated alcohol compound as the reaction gas raw materials and/or other reaction gas raw materials are directly deposited on the surface of the substrate. At this time, the required amount of reaction gas raw materials increases, and to a certain extent will affect the reaction speed.

Further, according to an embodiment of the present disclosure, the preparation process of the hydrophobic surface coating may be: preparing a hydrophobic nanocoating on a substrate surface by using a PECVD process, placing the substrate in a vacuum or low pressure reaction chamber, introducing a plasma source gas such as an inert gas first, and applying glow discharge to generate plasma before introducing the reaction gas raw materials such as the fluorinated alcohol compound to activate the reaction gas raw materials to cause a chemical vapor deposition reaction on the substrate surface. This kind of reaction raw materials may be a chemical substance that is a gas at normal temperatures and pressures, or be a vapor formed by a liquid substance with a boiling point lower than 350° C. under atmospheric pressure through decompressing, heating, other manners.

According to an embodiment of the present disclosure, the process of preparing the hydrophobic nanocoating by the plasma device comprises the following steps:

1) Preparing a Substrate.

Before performing chemical vapor deposition on a substrate, the substrate needs to be cleaned first. Dust, moisture, and grease, etc. on the surface of the substrate will adversely affect the deposition effect. The substrate is first cleaned with acetone or isopropanol, and then put into a drying oven to dry.

2) Carrying Out Chemical Vapor Deposition on the Substrate to Prepare a Nanocoating.

(1) The substrate with a clean surface is placed in a reaction chamber of the plasma device or equipment, and then the reaction chamber is continuously vacuumized to achieve a vacuum degree therein of 1 to 2000 millitorr;

(2) A plasma source gas is introduced, and radio frequency discharge, or microwave or ultraviolet radiation or other means is used in the chamber, to generate plasma therein, to pretreat the substrate.

It is worth mentioning that the plasma source gas is an inert gas or a gas that does not react easily, the plasma source gas will not be deposited to form the hydrophobic surface coating. That is, the plasma source gas will not become a component of the hydrophobic surface coating, but through the interaction of the plasma source gas on the surface, a tiny etching etc. phenomena are generated. Therefore, the surface of the substrate may be cleaned well and good deposition conditions may be provided for the deposition of the reaction gas raw materials, so that the deposited hydrophobic surface coating is more firmly bonded to the surface of the substrate.

(3) The pressure and temperature of the vacuum reaction chamber are set, and the reaction gas raw materials and/or crosslinking agent are introduced, wherein the reaction gas raw materials and the crosslinking agent may be introduced at the same time or sequentially.

The plasma generation power is adjusted to 1~500 W and the chamber temperature is adjusted to 10~100° C. to perform the plasma chemical vapor deposition. After the reaction is completed, the monomer is stopped being fed and the chamber pressure is restored to atmospheric pressure.

The reaction gas raw materials may be introduced simultaneously with the plasma source gas, or be introduced, after the plasma source gas is introduced and following a pretreatment for 1~1200 seconds of the substrate, with the crosslinking agent or alone according to the process parameters.

Preferably, the plasma source gas selects an inert gas, such as helium.

The reaction gas raw materials are one or more fluorinated alcohol compounds.

The substrate to be processed may be a metal, PCB, fabric, electronic device surface, and the like.

Further, preferably, the plasma device has a working power ranging from 1 W to 500 W, a pressure ranging from 10 millitorr to 500 millitorr, and a temperature ranging from 30° C. to 60° C.

Example 1

The present disclosure provides a hydrophobic surface coating applied to a PCB by a preparation method therefor comprising the following steps:

A substrate of the PCB was cleaned first with acetone or isopropanol, dried with a dust-free cloth, and then put into a drying oven to dry for 24 hours.

The dried PCB was placed into a 300 L plasma vacuum reaction chamber, and the reaction chamber was continuously vacuumized to achieve a vacuum degree of 20 millitorr.

A plasma source gas of helium was introduced at a flow rate of 20 sccm, and the radio frequency discharge was turned on to pretreat the PCB with a discharge power of 120 W for a discharge time of 100 seconds during the pretreatment stage.

A reaction gas raw material of perfluorohexyl ethanol was vaporized and introduced into the reaction chamber at a flow rate of 150 µL/min for 2500 seconds, with a discharge power of 200 W and a pulse width during discharge of 100 µs, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the PCB was taken out. That is, a layer of hydrophobic surface coating was coated on a PCB.

Example 2

The present disclosure provides a hydrophobic surface coating applied to a copper sheet by a preparation method therefor comprising the following steps:

A substrate of the copper sheet was cleaned first with acetone or isopropanol, dried with a dust-free cloth, and then put into a drying oven to dry for 24 hours.

The dried copper sheet was placed into a 500 L plasma vacuum reaction chamber, and the reaction chamber was continuously vacuumized to achieve a vacuum degree of 80 millitorr.

A plasma source gas of helium was introduced at a flow rate of 20 sccm, and the microwave plasma discharge was turned on to pretreat the copper sheet with a discharge power of 500 W for a discharge time of 600 seconds during the pretreatment stage.

A reaction gas raw material of perfluorobutyl ethanol was vaporized and introduced into the reaction chamber at a flow rate of 350 µL/min, with a microwave plasma discharge power of 500 W for a continued discharge time of 600 seconds, to perform a chemical vapor deposition on the surface of the substrate, to prepare a nanocoating.

After the coating preparation was completed, compressed air was introduced to restore the reaction chamber to atmospheric pressure, the chamber was opened, and the copper sheet was taken out. That is, a layer of hydrophobic surface coating was coated on a copper sheet.

Example 3

The present disclosure provides a hydrophobic surface coating applied to a fabric by a preparation method therefor comprising the following steps:

A substrate of the fabric was cleaned first with acetone or isopropanol, dried with a dust-free cloth, and then put into a drying oven to dry for 24 hours.

The dried fabric was placed into a 1000 L plasma vacuum reaction chamber, and the reaction chamber was continuously vacuumized to achieve a vacuum degree of 80 millitorr.

A plasma source gas of helium was introduced at a flow rate of 40 sccm, and the radio frequency discharge was turned on to pretreat the fabric with a discharge power of 50 W for a discharge time of 300 seconds during the pretreatment stage.

A crosslinking agent, 1,2-epoxy-4-vinylcyclohexane, was introduced first at a flow rate of 320 μL/min for a time of 2000 seconds. Thereafter, a reaction gas raw material of perfluorohexyl ethanol was vaporized and then introduced into the reaction chamber at a flow rate of 150 μL/min for a time of 3000 seconds, with a discharge power of 100 W and a pulse width during discharge of 200 μs, to perform a chemical vapor deposition on the surface of the substrate, to prepare a nanocoating.

After the coating preparation was completed, compressed air was introduced to restore the reaction chamber to atmospheric pressure, the chamber was opened, and the fabric was taken out. That is, a layer of hydrophobic surface coating was coated on a fabric.

Example 4

The present disclosure provides a hydrophobic nanocoating applied to an electronic device by a preparation method therefor comprising the following steps:

A substrate of the electronic device was cleaned first with acetone or isopropanol, dried with a dust-free cloth, and then put into a drying oven to dry for 24 hours.

The dried electronic device was placed into a 1000 L plasma vacuum reaction chamber, and the reaction chamber was continuously vacuumized to achieve a vacuum degree of 80 millitorr.

A plasma source gas of helium was introduced at a flow rate of 40 sccm, and the radio frequency discharge was turned on to pretreat the electronic device with a discharge power of 50 W for a discharge time of 300 seconds during the pretreatment stage.

A crosslinking agent, 1,2-epoxy-4-vinylcyclohexane, was introduced together with a reaction gas raw material of perfluorohexyl ethanol which had been vaporized into the reaction chamber at flow rates of 320 μL/min and 150 μL/min respectively for a time of 3000 seconds, with a discharge power of 100 W and a pulse width during discharge of 200 μs, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the electronic device was taken out. That is, a layer of hydrophobic surface coating was coated on an electronic device.

Example 5

The present disclosure provides a hydrophobic nanocoating applied to a PCB by a preparation method therefor comprising the following steps:

A substrate of the PCB was cleaned first with acetone or isopropanol, dried with a dust-free cloth, and then put into a drying oven to dry for 24 hours.

The dried PCB was placed into a 1000 L plasma vacuum reaction chamber, and the reaction chamber was continuously vacuumized to achieve a vacuum degree of 80 millitorr.

A plasma source gas of helium was introduced at a flow rate of 40 sccm, and the radio frequency discharge was turned on to pretreat the PCB with a discharge power of 300 W for a discharge time of 100 seconds during the pretreatment stage.

A crosslinking agent, 1,2-epoxy-4-vinylcyclohexane, was introduced first at a flow rate of 300 μL/min for a time of 2000 seconds. Thereafter, a reaction gas raw material of perfluorobutyl ethanol was vaporized and then introduced into the reaction chamber at a flow rate of 200 μL/min for a time of 3000 seconds, with a discharge power of 300 W and a pulse width during discharge of 200 μs, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the PCB was taken out. That is, a layer of hydrophobic surface coating was coated on a PCB.

Example 6

The present disclosure provides a hydrophobic nanocoating applied to a PCB by a preparation method therefor comprising the following steps:

A substrate of the PCB was cleaned first with acetone or isopropanol, dried with a dust-free cloth, and then put into a drying oven to dry for 24 hours.

The dried PCB was placed into a 1000 L plasma vacuum reaction chamber, and the reaction chamber was continuously vacuumized to achieve a vacuum degree of 80 millitorr.

A plasma source gas of helium was introduced at a flow rate of 40 sccm, and the radio frequency discharge was turned on to pretreat the PCB with a discharge power of 300 W for a discharge time of 100 seconds during the pretreatment stage.

A crosslinking agent, 1,2-epoxy-4-vinylcyclohexane, was introduced together with a reaction gas raw material of perfluorobutyl ethanol which had been vaporized into the reaction chamber at flow rates of 300 μL/min and 200 μL/min respectively for a time of 3000 seconds, with a discharge power of 300 W and a pulse width during discharge of 200 μs, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the PCB was taken out. That is, a layer of hydrophobic nanocoating was coated on a PCB.

It is worth mentioning that in the foregoing examples, a PCB, a copper sheet, a fabric, and an electronic device are used as examples of substrates respectively to illustrate the formation process of the hydrophobic surface coating. However, in other examples of the present disclosure, the plasma-enhanced chemical vapor deposition may also be performed on other substrates to form the hydrophobic surface coating, and the present disclosure is not limited thereto in this aspect.

Further, the parameters of the above-mentioned examples were detected.

The thicknesses of the hydrophobic surface coatings were measured with an American Filmetrics F20-UV-Thin Film Thickness Measuring Instrument.

The water contact angles of the hydrophobic surface coatings were tested according to GB/T 30447-2013 standard.

Salt spray resistance test was carried out according to GB/T 2423.18-2000 Environmental Test method for electric and electronic products.

ATTACHED TABLE 1

Various performance parameters of Examples 1-6

| Examples | Thickness/ nm | Contact angle/° | Salt spray resistance test (h) |
|---|---|---|---|
| Example 1 | 175 | 122 | 34 |
| Example 2 | 155 | 90 | 10 |
| Example 3 | 234 | 130 | — |
| Example 4 | 202 | 125 | 40 |
| Example 5 | 198 | 97 | 35 |
| Example 6 | 167 | 108 | 37 |

Note:
Salt spray resistance test was not performed for the fabric of Example 3.

By adopting the technology of the present disclosure, hydrophobic surface coatings capable of being applied to surfaces of different substrates may be obtained. By using the plasma chemical vapor deposition method, a hydrophobic nanofilm with similar effect to that when using perfluoroacrylates was obtained. The salt spray resistance of the coatings may be improved by adding a crosslinking agent.

The present disclosure provides a hydrophobic surface coating, formed from: one or more fluorinated alcohols as raw materials. Further, the hydrophobic surface coating is formed on a surface of a substrate by means of plasma-enhanced chemical vapor deposition from: one or more fluorinated alcohols as raw materials.

Furthermore, the hydrophobic surface coating is suitable for being deposited on a surface of a glass substrate, to improve the surface properties of the glass substrate.

The hydrophobic surface coating has good hydrophobicity, light transmittance and wear resistance. Further, the hydrophobic surface coating has good hydrophobicity and lipophobicity. When water is attached to the waterproof nanofilm, it has a static contact angle of greater than 100°. For example, the static contact angle ranges from 100° to 105°, 105° to 110°, 110° to 115°, or 115° to 120°. For example, water has a static contact angle of 107°, 109°, 110°, 114°, 115°, 116°, or 120°. The hydrophobic surface coating has good corrosion resistance. For example, the substrate has good wear resistance when the hydrophobic surface coating is deposited on the surface thereof, as shown in the following specific examples.

The hydrophobic surface coating has a relatively small thickness, so that the use of the surface of the substrate will not be affected. The thickness range is exemplified as but not limited to from 10 nm to 1000 nm. For example, the hydrophobic surface coating has a thickness selected from: 150 nm to 170 nm, 170 nm to 190 nm, 190 nm to 210 nm, 210 nm to 230 nm, or 230 nm to 250 nm. For example, the hydrophobic surface coating has a thickness of: 170 nm, 185 nm, 190 nm, 195 nm, 200 nm, 220 nm, or 235 nm.

According to an embodiment of the present disclosure, the hydrophobic surface coating is formed on a surface of a substrate through a plasma-enhanced chemical vapor deposition (PECVD) process. That is, during the preparation process, the surface of the substrate is exposed in a reaction chamber of a reaction device of a plasma device in which plasma is formed, and the hydrophobic surface coating is formed thereon through the deposition reaction of the reaction raw materials, fluorinated alcohol and/or other reactants.

Compared with other existing deposition processes, the plasma-enhanced chemical vapor deposition (PECVD) process has many advantages: (1) dry film-forming does not need to use an organic solvent; (2) the etching effect of plasma on the substrate surface makes the adhesive property between the deposited thin film and the substrate good; (3) the coating may be uniformly deposited on an irregular substrate surface with an extremely strong vapor permeability; (4) the coating has good designability, the chemical vapor method making it possible to control the coating thickness at a nanometer scale as compared to the liquid phase method with micron level control accuracy; (5) the coating structure is easy to design, the chemical vapor method using plasma to activate, and for a composite coating of different materials, multiple raw materials being possible to be combined together through the control of input energy without need to design a specific initiator to initiate; (6) the compactness is good, the chemical vapor deposition method often activating multiple active sites during the plasma initiation process, similar to a solution reaction in which there are multiple functional groups on one molecule, and a crosslinked structure is formed by the multiple functional groups between the molecular chains; and (7) as a technical means for coating processing, its universality is extremely good, and objects to coat and raw materials used for coating may both be selected from very wide ranges.

The plasma-enhanced chemical vapor deposition (PECVD) process generates plasma through glow discharge, and the discharge method includes radio frequency discharge, microwave discharge, intermediate frequency discharge, electric spark discharge, and the like.

Further, according to an embodiment of the present disclosure, the fluorinated alcohol compound as a reaction raw material has a structure of general formula: $OH-C_nH_mF_{2n+1-m}$, wherein $n > m+1$.

It is worth mentioning that the fluorinated alcohol having a structure of general formula $OH-C_nH_mF_{2n+1-m}$, $n > m+1$ is more suitable to be deposited on a surface of a glass substrate by means of plasma-enhanced chemical vapor deposition. During the deposition process, the plasma acts on the surface of the glass to form on the surface a silanol group, which is liable to interact with the hydroxyl group in the raw material of fluorinated alcohol, thereon, so that the hydrophobic surface coating is more firmly bonded to the surface of the substrate, thus showing more excellent surface properties. On the other hand, when the material structure of the processed substrate exhibits the nature of a hydroxyl group, the fluorinated alcohol compound conforming to the above general formula and the substrate tend to form more excellent the hydrophobic surface coating.

As an example, the reaction raw material of the fluorinated alcohol compound is selected from: one or more of perfluorohexyl ethanol, perfluorobutyl ethanol, perfluorobutyl propanol, perfluorohexyl propanol, 1,2,3,3,4,4,5,5,6,6,6-undecafluoro-hexan-1-ol, 3-(difluoromethyl)-2,3,4,4,4-pentafluoro-2-(trifluoromethyl)-butan-1-ol.

In some embodiments, the fluorinated alcohol compound reaction gas raw material and a crosslinking agent have a vapor deposition reaction to form the hydrophobic surface coating. In other words, the fluorinated alcohol compound and the crosslinking agent are both reaction gas raw materials, and are deposited together on the surface of the substrate to form the hydrophobic surface coating.

The crosslinking agent compound has a structure of the following formula:

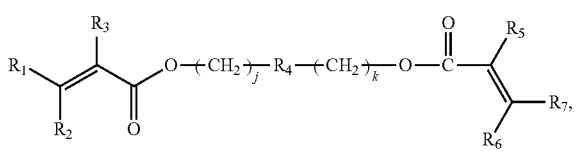

wherein, $R_1$, $R_2$, $R_3$, $R_5$, $R_6$, and $R_7$ are independently selected from hydrogen, alkyl, aryl, halogen, haloalkyl, and haloaryl; j and k are integers from 0 to 10 and are not 0 at the same time; $R_4$ may be a bond, —CO—, —COO—, an arylidene, an alicyclic alkylidene, or an aliphatic alkylidene substituted with hydroxy. The crosslinking agent may also be a multifunctional group compound comprising ester groups, ethers, epoxy groups, cyano groups.

According to one embodiment, the crosslinking agent of the hydrophobic surface coating is from a group consisting of: glycidyl methacrylate, allyl glycidyl ether, 1,2-epoxy-4-vinylcyclohexane, 3-(2,3-epoxypropoxy)propylvinyldimethoxysilane, and enbucrilate.

Further, according to some embodiments of the present disclosure, when preparing the hydrophobic surface coating, a plasma source gas is introduced into the reaction device, to activate the chemical deposition reaction of the reaction gas raw materials. The plasma source gas is exemplified as but not limited to an inert gas, wherein the inert gas is exemplified as but not limited to He and Ar. The plasma source gas may be a single gas or a mixture of two or more gases, and may be introduced at the same time as the reaction gas raw materials or be introduced sequentially with the reaction gas raw materials. Preferably, the plasma source gas is introduced first, and then the reaction gas raw materials are introduced. Of course, in an embodiment of the present disclosure, there may be no plasma source gas, that is, the fluorinated alcohol compound as the reaction gas raw materials and/or other reaction gas raw materials are directly deposited on the surface of the substrate. At this time, the required amount of reaction gas raw materials increases, and will affect the reaction speed to a certain extent.

Further, according to an embodiment of the present disclosure, the preparation process of the hydrophobic surface coating may be: preparing a hydrophobic nanocoating on a surface of a substrate by using a PECVD process, placing the substrate in a vacuum or low pressure reaction chamber, introducing a plasma source gas such as an inert gas first, and applying glow discharge to generate plasma before introducing the reaction gas raw materials such as the fluorinated alcohol compound to activate the reaction gas raw materials to cause a chemical vapor deposition reaction on the surface of the substrate. This kind of reaction raw materials may be a chemical substance that is a gas at normal temperatures and pressures, or be a vapor formed by a liquid substance with a boiling point lower than 350° C. under atmospheric pressure through decompressing, heating, etc., manners.

According to an embodiment of the present disclosure, the process of preparing the hydrophobic nanocoating by the plasma device comprises the following steps:

1) Preparing a Substrate.

Before performing a chemical vapor deposition on a substrate, the substrate needs to be cleaned first. Dust, moisture, and grease, etc. on the surface of the substrate will adversely affect the deposition effect. First the substrate is cleaned with acetone or isopropanol, and then it is put into a drying oven to dry.

2) Carrying Out Chemical Vapor Deposition on the Substrate to Prepare a Nanocoating.

(1) The substrate with a clean surface is placed in the reaction chamber of the plasma device or equipment, and then the reaction chamber is continuously vacuumized to achieve a vacuum degree therein of 1~2000 millitorr;

(2) A plasma source gas is introduced, and radio frequency discharge, or microwave or ultraviolet radiation or other means is used in the chamber to generate plasma in the chamber to pretreat the substrate.

It is worth mentioning that when the plasma source gas is an inert gas or a gas that does not react easily, the plasma source gas will not be deposited to form the hydrophobic surface coating, that is, the plasma source gas will not become a component of the hydrophobic surface coating, but through the interaction of the plasma source on the surface, a tiny etching etc. phenomena are generated, therefore the surface of the substrate may be cleaned well and good deposition conditions may be provided for the deposition of the reaction gas raw materials, so that the deposited hydrophobic surface coating is more firmly bonded to the surface of the substrate.

(3) The pressure and temperature of the vacuum reaction chamber are set, and the reaction gas raw materials and/or crosslinking agent are introduced, wherein the reaction gas raw materials and the crosslinking agent may be introduced at the same time or sequentially. The plasma generation power is adjusted to 1~500 W and the chamber temperature is adjusted to 10~100° C. to perform the plasma chemical vapor deposition. After the reaction is completed, the monomer is stopped being fed and the chamber pressure is restored to atmospheric pressure.

The reaction gas raw materials may be introduced simultaneously with the plasma source, or be introduced, after the plasma source is introduced and following a pretreatment for 1~1200 seconds of the substrate, with the crosslinking agent or alone according to process parameters.

Preferably, the plasma source gas selects an inert gas, such as helium, argon.

The reaction gas raw materials are one or more fluorinated alcohol compounds.

The treated substrate is preferably a glass substrate.

Further, preferably, the plasma device has a working power ranging from 1 W to 500 W, a pressure ranging from 10 millitorr to 500 millitorr, and a temperature ranging from 30° C. to 60° C.

Example a1

The present disclosure provides a hydrophobic surface coating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 80 millitorr.

A plasma source gas of argon was introduced at a flow rate of 20 sccm, and the radio frequency discharge was turned on to pretreat the glass substrate with a discharge power of 50 W for a discharge time of 300 seconds during the pretreatment stage.

A reaction gas raw material of perfluorobutyl ethanol was vaporized and introduced into the reaction chamber at a flow rate of 260 μL/min, with a discharge power of 100 W and a pulse width during discharge of 3 ms, for a discharge time of 3300 seconds, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the glass substrate was taken out. That is, a layer of hydrophobic surface coating was coated on a glass substrate.

Comparative Example a1

A coating process was carried out under the same conditions as in Example a1, except that the glass substrate was replaced with a PCB.

Example a2

The present disclosure provides a hydrophobic surface coating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 100 millitorr.

A plasma source gas of argon was introduced at a flow rate of 20 sccm, and the radio frequency discharge was turned on to pretreat the glass substrate with a discharge power of 200 W for a discharge time of 600 seconds during the pretreatment stage.

A reaction gas raw material of perfluorohexyl ethanol was vaporized and introduced into the reaction chamber at a flow rate of 500 μL/min, with a discharge power of 300 W and a pulse width during discharge of 100 μs, for a discharge time of 2500 seconds, to perform a chemical vapor deposition on the surface of the glass substrate, to prepare a nanocoating.

After the coating preparation was completed, compressed air was introduced to restore the reaction chamber to atmospheric pressure, the chamber was opened, and the glass substrate was taken out. That is, a layer of hydrophobic surface coating was coated on a glass substrate.

Comparative Example a2

A coating process was carried out under the same conditions as in Example a2, except that the glass substrate was replaced with a PCB.

Example a3

The present disclosure provides a hydrophobic surface coating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 40 millitorr.

A plasma source gas of argon was introduced at a flow rate of 40 sccm, and the microwave discharge was turned on to pretreat the glass substrate with a discharge power of 500 W for a discharge time of 600 seconds during the pretreatment stage.

A reaction gas raw material of perfluorobutyl propanol was vaporized and introduced into the reaction chamber at a flow rate of 400 μL/min, with a microwave discharge power of 500 W for a discharge time of 1200 seconds, to perform a chemical vapor deposition on the surface of the substrate, to prepare a nanocoating.

After the coating preparation was completed, compressed air was introduced to restore the reaction chamber to atmospheric pressure, the chamber was opened, and the glass substrate was taken out. That is, a layer of hydrophobic surface coating was coated on a glass substrate.

Comparative Example a3

A coating process was carried out under the same conditions as in Example a3, except that the glass substrate was replaced with a PCB.

Example a4

The present disclosure provides a hydrophobic nanocoating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 40 millitorr.

A plasma source gas of helium was introduced at a flow rate of 40 sccm, and the microwave discharge was turned on to pretreat the glass substrate with a discharge power of 500 W for a discharge time of 600 seconds during the pretreatment stage.

A reaction gas raw material of perfluorohexyl propanol was vaporized and introduced simultaneously into the reaction chamber at a flow rate of 350 μL/min, with a microwave discharge power of 500 W for a discharge time of 1200 seconds, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the glass substrate was taken out. That is, a layer of hydrophobic surface coating was coated on a glass substrate.

Comparative Example a4

A coating process was carried out under the same conditions as in Example a4, except that the glass substrate was replaced with a PCB.

Example a5

The present disclosure provides a hydrophobic nanocoating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 300 millitorr.

A plasma source gas of argon was introduced at a flow rate of 80 sccm, and the radio frequency discharge was turned on to pretreat the glass substrate with a discharge power of 500 W for a discharge time of 3000 seconds during the pretreatment stage.

A reaction gas raw material of 1,2,3,3,4,4,5,5,6,6,6-undecafluoro-hexan-1-ol was vaporized and introduced into the reaction chamber at a flow rate of 1000 µL/min, with a discharge power of 500 W for a discharge time of 3000 seconds, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the glass substrate was taken out. That is, a layer of hydrophobic surface coating was coated on a glass substrate.

Comparative Example a5

A coating process was carried out under the same conditions as in Example a5, except that the glass substrate was replaced with a PCB.

Example a6

The present disclosure provides a hydrophobic nanocoating applied to a glass substrate by a preparation method therefor comprising the following steps:

The glass substrate was cleaned first with acetone or isopropanol, dried with a dust-free cloth, and then put into a drying oven to dry for 24 hours.

The dried glass substrate was placed into a 1000 L plasma vacuum reaction chamber, and the reaction chamber was continuously vacuumized to achieve a vacuum degree of 80 millitorr.

A plasma source gas of helium was introduced at a flow rate of 300 sccm, and the radio frequency discharge was turned on to pretreat the glass substrate with a discharge power of 500 W for a discharge time of 3000 seconds during the pretreatment stage.

A reaction gas raw material of 3-(difluoromethyl)-2,3,4,4,4-pentafluoro-2-(trifluoromethyl)-butan-1-ol was vaporized and introduced simultaneously into the reaction chamber at a flow rate of 1000 µL/min, with a discharge power of 500 W for a discharge time of 3000 seconds, to perform a chemical vapor deposition on the surface of the substrate, to prepare a hydrophobic surface coating.

After the coating preparation was completed, compressed air was introduced to restore the reaction chamber to atmospheric pressure, the chamber was opened, and the glass substrate was taken out. That is, a layer of hydrophobic nanocoating was coated on a glass substrate.

Comparative Example a6

A coating process was carried out under the same conditions as in Example a6, except that the glass substrate was replaced with a PCB.

Example a7

A coating process was carried out under the same conditions as in Example a6, except that a crosslinking agent of 3-(2,3-epoxypropoxy)propylvinyldimethoxysilane was added into the reaction gas raw material.

Example a8

A coating process was carried out under the same conditions as in Example a6, except that a crosslinking agent of glycidyl methacrylate was added into the reaction gas raw material.

Further, the parameters of the above-mentioned examples were detected.

Thicknesses of the hydrophobic surface coatings were measured with the American Filmetrics F20-UV-Thin Film Thickness Measuring Instrument.

The water contact angles of the hydrophobic surface coatings were tested according to GB/T 30447-2013 standard.

The wear resistance of the hydrophobic surface coatings was tested by XM-860 wear tester.

The light transmittance of the hydrophobic surface coatings was tested with a British Lambda950 UV Spectrophotometer.

ATTACHED TABLE 1

Various performance parameters of Examples a1-a8 and Comparative Examples a1-a6

| Examples | Thickness/nm | Contact angle/° | wear resistance (cycling times) | light transmittance/% |
|---|---|---|---|---|
| Example a1 | 195 | 114 | 2500 | 95 |
| Comparative Example a1 | 180 | 108 | 2000 | 90 |
| Example a2 | 220 | 115 | 2300 | 93 |
| Comparative Example a2 | 200 | 110 | 2100 | 91 |
| Example a3 | 190 | 110 | 1700 | 94 |
| Comparative Example a3 | 180 | 107 | 1500 | 90 |
| Example a4 | 200 | 116 | 2500 | 92 |
| Comparative Example a4 | 195 | 110 | 2200 | 90 |
| Example a5 | 235 | 120 | 2200 | 95 |
| Comparative Example a5 | 220 | 115 | 2000 | 91 |
| Example a6 | 200 | 110 | 2600 | 93 |
| Comparative Example a6 | 193 | 105 | 2300 | 90 |
| Example a7 | 210 | 115 | 2700 | 95 |
| Example a8 | 230 | 120 | 2800 | 96 |

In the above Examples a1-a6, the hydrophobic surface coatings were deposited on the surfaces of the glass substrates under the predetermined conditions through the plasma-enhanced chemical deposition method using preferable different fluorinated alcohol fluorocarbon compounds as the reaction gas raw materials, respectively. It can be seen from the test results that, the overall test result of the hydrophobic surface coatings formed on the surface of the glass substrate in each of the Examples shows that the static contact angle of water is relatively large, that is, the hydrophobic surface coatings have good hydrophobic properties and good wear resistance.

In the Comparative Examples a1-a6, hydrophobic surface coatings were formed by deposition with PCBs being used as the substrates, respectively, under the same conditions as in the corresponding Examples a1-a6. Compared with the corresponding examples, it can be seen that, with the same reaction gas raw materials and substantially the same conditions, when the PCB substrates were used, the hydrophobic surface coatings had both weakened hydrophobicity and wear resistance. This means that, the reaction gas raw materials are more suitable for deposition on glass substrates, or in other words, when they are matched with glass substrates, better performance will be brought.

In Examples a7 and a8, different crosslinking agents were added under the same conditions as in Example a6, respectively. The comparison of Examples a6, a7 and a8 shows that, the addition of the crosslinking agent may further optimize the performance of the hydrophobic surface coating to a certain extent.

In the technical solutions of the present disclosure, the hydrophobic surface coating is formed from fluorinated alcohols conforming to a predetermined general formula as the reaction gas raw materials by depositing on the surface of the glass substrate by means of the plasma-enhanced chemical vapor deposition method. A surface coating with more superior performance is formed by cooperation between the characteristics of the fluorinated alcohols and the glass substrate, and has a better surface modification effect than other deposition materials or other substrates. Moreover, in some Examples, the addition of the crosslinking agent may further improve the performance of the coating.

Those skilled in the art should understand that the embodiments of the present disclosure shown in the foregoing description are merely examples and do not limit the present disclosure. The advantages of the present disclosure have been completely and effectively realized. The functions and structural principles of the present disclosure have been shown and explained in the embodiments. The embodiments of the present disclosure may have any deformations or modifications without departing from the principles.

What is claimed is:

1. A hydrophobic surface coating, being formed on a surface of a substrate by a plasma-enhanced chemical vapor deposition method, with a crosslinking agent and one or more fluorinated alcohol compounds as a reaction gas raw material, wherein the crosslinking agent has the formula:

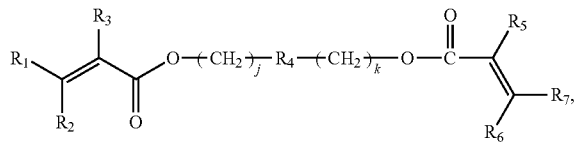

wherein $R_1$, $R_2$, $R_3$, $R_5$, $R_6$ and $R_7$ are selected from hydrogen, alkyl, aryl, halogen, haloalkyl, and haloaryl; j and k are integers from 0 to 10 and are not 0 at the same time; and $R_4$ is a bond, —CO—, —COO—, an arylidene, an alicyclic alkylidene, or an aliphatic alkylidene substituted with hydroxy; or wherein the crosslinking agent is selected from a group consisting of: one or more of glycidyl methacrylate, allyl glycidyl ether, 1,2-epoxy-4-vinylcyclohexane, 3-(2,3-epoxypropoxy)propylvinyldimethoxysilane, and enbucrilate.

2. The hydrophobic surface coating according to claim 1, wherein the fluorinated alcohol compounds have a structure formula $C_nF_{2n+1}$—$C_mH_{2m}$—OH, wherein n is an integer from 1 to 12, and m is an integer from 0 to 4, or wherein the fluorinated alcohol compounds have a structure formula of OH—$C_nH_mF_{2n+1-m}$, wherein n>m+1.

3. The hydrophobic surface coating according to claim 1, wherein the fluorinated alcohol compound is a primary alcohol.

4. The hydrophobic surface coating according to claim 1, wherein the fluorinated alcohol compound is selected from a group consisting of: one or more of perfluorohexyl ethanol, perfluorobutyl ethanol, perfluorobutyl propanol, perfluorohexyl propanol, 1,2,3,3,4,4,5,5,6,6,6-undecafluoro-hexan-1-ol, and 3-(difluoromethyl)-2,3,4,4,4-pentafluoro-2-(trifluoromethyl)-butan-1-ol.

5. The hydrophobic surface coating according to claim 1, wherein the reaction gas raw material further includes a crosslinking agent, a multifunctional group compound comprising an ester group, an ether, an epoxy group, and/or a cyano group.

6. The hydrophobic surface coating according to claim 1, wherein when preparing the hydrophobic surface coating, a plasma source gas is introduced first, so as to activate a chemical deposition reaction of the reaction gas raw material.

7. The hydrophobic surface coating according to claim 6, wherein the plasma source gas is selected from: one or more of inert gases.

8. A method for preparing the hydrophobic surface coating according to claim 1, comprising steps of: introducing the reaction gas raw material into a reaction chamber of a plasma device, and performing plasma-enhanced chemical vapor deposition on the surface of the substrate in the plasma device to form the hydrophobic surface coating.

9. The method for preparing the hydrophobic surface coating according to claim 8, wherein the fluorinated alcohol compounds have a structure formula: $C_nF_{2n+1}$—$C_mH_{2m}$—OH, wherein n is an integer from 1 to 8, and m is an integer from 2 to 3 or wherein the fluorinated alcohol compounds have a structure formula of OH—$C_nH_mF_{2n+1-m}$, wherein n>m+1.

10. The method for preparing the hydrophobic surface coating according to claim 8, wherein the fluorinated alcohol compound is a primary alcohol.

11. The method for preparing the hydrophobic surface coating according to claim 8, wherein the fluorinated alcohol compound is selected from a group consisting of: one or more of perfluorohexyl ethanol, perfluorobutyl ethanol, perfluorobutyl propanol, perfluorohexyl propanol, 1,2,3,3,4,4,5,5,6,6,6-undecafluoro-hexan-1-ol, and 3-(difluoromethyl)-2,3,4,4,4-pentafluoro-2-(trifluoromethyl)-butan-1-ol.

12. The method for preparing the hydrophobic surface coating according to claim 8, wherein the crosslinking agent is a multifunctional group compound comprising an ester group, an ether, an epoxy group, and/or a cyano group.

13. The method for preparing the hydrophobic surface coating according to claim 8, comprising a step of: introducing a plasma source gas first before introducing the reaction gas raw material, so as to activate a chemical deposition reaction of the reaction gas raw material.

14. The method for preparing the hydrophobic surface coating according to claim 13, wherein the plasma source gas is selected from: one or more of inert gases.

15. The method for preparing the hydrophobic surface coating according to claim 8, wherein the plasma device has an operating power ranging from 1 W to 500 W.

16. The method for preparing the hydrophobic surface coating according to claim 8, wherein the substrate is a glass substrate.

17. The method for preparing the hydrophobic surface coating according to claim 8, wherein a silanol group is formed on the surface of the substrate under the action of the plasma.

18. The hydrophobic surface coating according to claim 1, wherein the substrate is a glass substrate.

19. The hydrophobic surface coating according to claim 1, wherein a silanol group is formed on the surface of the substrate under the action of the plasma.

\* \* \* \* \*